United States Patent
Yuan et al.

(10) Patent No.: US 11,435,855 B2
(45) Date of Patent: Sep. 6, 2022

(54) CAPACITANCE DETECTION CIRCUIT, TOUCH CONTROL CHIP AND ELECTRONIC DEVICE

(71) Applicant: SHENZHEN GOODIX TECHNOLOGY CO., LTD., Shenzhen (CN)

(72) Inventors: Guangkai Yuan, Shenzhen (CN); Hong Jiang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/477,220

(22) Filed: Sep. 16, 2021

(65) Prior Publication Data
US 2022/0083194 A1 Mar. 17, 2022

Related U.S. Application Data

(63) Continuation of application No. PCT/CN2020/114890, filed on Sep. 11, 2020.

(51) Int. Cl.
*G06F 3/041* (2006.01)
*H03F 3/45* (2006.01)
*G06F 3/044* (2006.01)

(52) U.S. Cl.
CPC .......... *G06F 3/04184* (2019.05); *G06F 3/044* (2013.01); *G06F 3/04166* (2019.05); *H03F 3/45475* (2013.01)

(58) Field of Classification Search
None
See application file for complete search history.

(56) References Cited

U.S. PATENT DOCUMENTS 9,791,986 B2  10/2017 Ouh
10,042,482 B2   8/2018 Kim
(Continued)

FOREIGN PATENT DOCUMENTS

CN   101162162 A    4/2008
CN   101901073 A   12/2010
(Continued)

OTHER PUBLICATIONS

Chen, Jiagui. How to use lock-in amplifier correctly [J]. Physics, 1982, pp. 287-291, 11(5).

*Primary Examiner* — Stephen T. Reed

(57) ABSTRACT

A capacitance detection circuit, a touch control chip and an electronic device are provided, which could reduce the influence of a display screen noise on capacitance detection. The capacitance detection circuit includes: an amplification circuit, connected to a detection capacitance in a touch screen, and configured to amplify a capacitance signal of the detection capacitance and convert the capacitance signal into a voltage signal, the voltage signal configured to determine the detection capacitance; and a control circuit, connected to the amplification circuit, and configured to control a magnification of the amplification circuit, where a period in which a noise peak of a noise signal of a display screen is located includes consecutive N sub-periods, and a magnification of the amplification circuit in the N sub-periods is inversely proportional to a magnitude of the noise signal in the N sub-periods, $N>1$.

20 Claims, 6 Drawing Sheets

(56) References Cited

U.S. PATENT DOCUMENTS

| | | |
|---|---|---|
| 10,254,903 B2 | 4/2019 | Kim |
| 10,627,959 B2 | 4/2020 | Jiang et al. |
| 10,649,591 B2 | 5/2020 | Kim |
| 10,768,760 B2 | 9/2020 | Kim |
| 10,788,380 B2 | 9/2020 | Feng |
| 2007/0262966 A1* | 11/2007 | Nishimura ............ G06F 3/0443 345/173 |
| 2010/0110040 A1 | 5/2010 | Kim |
| 2010/0321334 A1* | 12/2010 | Oda ................... G06F 3/04166 345/174 |
| 2011/0227864 A1 | 9/2011 | Baek |
| 2012/0229421 A1 | 9/2012 | Kim |
| 2016/0098117 A1 | 4/2016 | Ouh |
| 2016/0224163 A1 | 8/2016 | Kim |
| 2016/0224188 A1 | 8/2016 | Kim |
| 2018/0004326 A1 | 1/2018 | Kim |
| 2018/0209858 A1 | 7/2018 | Feng |
| 2019/0179456 A1 | 6/2019 | Kim |
| 2019/0196654 A1 | 6/2019 | Jiang et al. |
| 2020/0387283 A1 | 12/2020 | Jiang et al. |

FOREIGN PATENT DOCUMENTS

| | | |
|---|---|---|
| CN | 101937140 A | 1/2011 |
| CN | 101937662 A | 1/2011 |
| CN | 102375639 A | 3/2012 |
| CN | 103853408 A | 6/2014 |
| CN | 105487730 A | 4/2016 |
| CN | 105824053 A | 8/2016 |
| CN | 106137186 A | 11/2016 |
| CN | 106331257 A | 1/2017 |
| CN | 106466177 A | 3/2017 |
| CN | 108064344 A | 5/2018 |
| CN | 108124474 A | 6/2018 |
| CN | 110462571 A | 11/2019 |
| JP | 2011039663 A | 2/2011 |
| KR | 101210924 B1 | 12/2012 |
| WO | 2015115873 A1 | 8/2015 |

\* cited by examiner

CAPACITANCE DETECTION CIRCUIT, TOUCH CONTROL CHIP AND ELECTRONIC DEVICE

CROSS-REFERENCE TO RELATED APPLICATIONS

This application is a continuation of International Application No. PCT/CN2020/114890, filed on Sep. 11, 2020, the disclosure of which is hereby incorporated by reference in its entirety.

TECHNICAL FIELD

Embodiments of the present application relate to the field of capacitance detection, and in particular, to a capacitance detection circuit, a touch control chip and an electronic device.

BACKGROUND

Capacitive sensors are widely used in electronic products to implement touch detection. When a conductor, such as a finger, touches and approaches a detection electrode in a touch screen of an electronic device, a capacitance corresponding to the detection electrode changes. By detecting a variation of the capacitance, information that the finger approaches or touches the detection electrode can be acquired, so as to determine operation of a user. However, a noise generated by a display screen of the electronic device will affect the foregoing detection result. Therefore, how to reduce the influence of a display screen noise on capacitance detection becomes an urgent problem to be solved.

SUMMARY

Embodiments of the present application provide a capacitance detection circuit, a touch control circuit and an electronic device, which can reduce the influence of a display screen noise on capacitance detection.

According to a first aspect, a capacitance detection circuit is provided, including:

an amplification circuit, connected to a detection capacitance in a touch screen, and configured to amplify a capacitance signal of the detection capacitance and convert the capacitance signal into a voltage signal, the voltage signal configured to determine the detection capacitance; and a control circuit, connected to the amplification circuit, and configured to control a magnification of the amplification circuit, where a period in which a noise peak of a noise signal of a display screen is located includes consecutive N sub-periods, and a magnification of the amplification circuit in the N sub-periods is inversely proportional to a magnitude of the noise signal in the N sub-periods, N>1.

In a possible implementation manner, the amplification circuit includes an operational amplifier, an adjustable resistance is connected between an input end and an output end of the operational amplifier, and the control circuit is specifically configured to: control a resistance value of the adjustable resistance, so that the magnification of the amplification circuit in the N sub-periods is inversely proportional to the magnitude of the noise signal in the N sub-periods.

In a possible implementation manner, the operational amplifier is a differential operational amplifier, one adjustable resistance is connected between a first input end and a first output end of the differential operational amplifier, and one adjustable resistance is connected between a second input end and a second output end of the differential operational amplifier.

In a possible implementation manner, a magnification of the amplification circuit is a constant value in a period in which a non-noise peak of the noise signal is located.

In a possible implementation manner, the constant value is greater than or equal to a maximum magnification of the amplification circuit in the N sub-periods.

In a possible implementation manner, N=3 or N=4.

In a possible implementation manner, a period in which the noise peak of the noise signal is located is determined according to a scanning frequency of a horizontal synchronization signal of the display screen.

In a possible implementation manner, a scanning cycle of the horizontal synchronization signal of the display screen includes one or two of the noise peaks.

In a possible implementation manner, the capacitance detection circuit further includes: a filter circuit, connected to the amplification circuit, and configured to perform filtering processing on the voltage signal output by the amplification circuit.

In a possible implementation manner, the capacitance detection circuit further includes: an ADC circuit connected to the filter circuit, and configured to convert the filtered voltage signal into a digital signal.

In a second aspect, a touch control chip is provided, including: the capacitance detection circuit in the foregoing first aspect and any one of the possible implementation manners of the first aspect.

In a third aspect, an electronic device is provided, including: a touch screen; a display; and the touch control chip in the foregoing second aspect and any one of the possible implementation manners of the second aspect.

On the basis of the above technical solution, the period in which the noise peak of the noise signal of the display screen is located is divided into consecutive N sub-periods, and the magnification of the amplification circuit in the N sub-periods is controlled by the control circuit, so that the magnification of the amplification circuit in the N sub-periods is inversely proportional to the magnitude of the noise signal in the N sub-periods, in order to avoid saturation of the amplification circuit. The capacitance detection circuit improves a signal-to-noise ratio of the capacitance detection while ensuring an effective operation of the amplification circuit, and has better detection performance.

DESCRIPTION OF EMBODIMENTS

The following describes technical solutions of the present application with reference to accompanying drawings.

Figure 1:
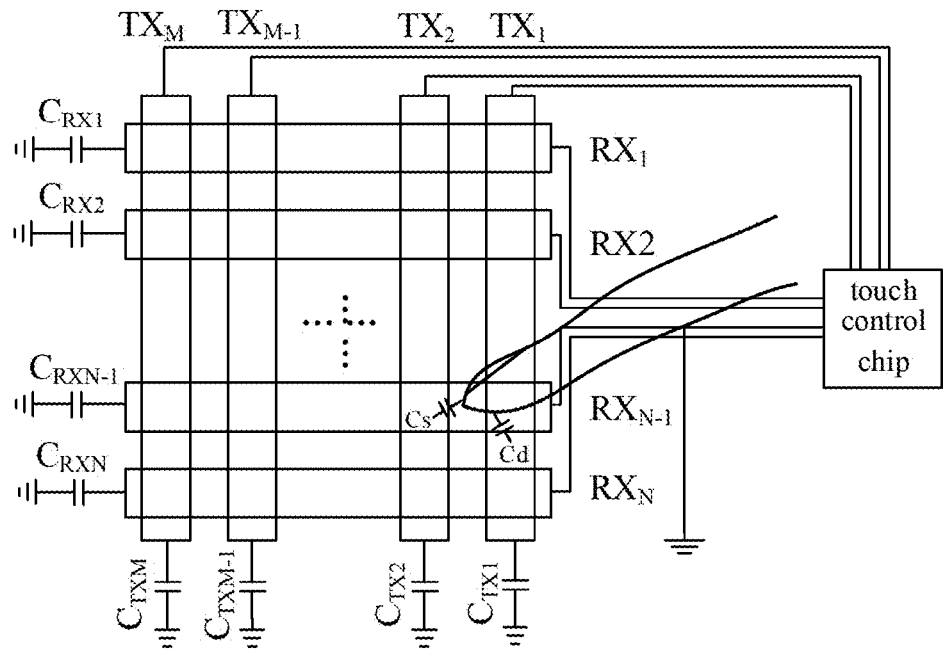
FIG. 1 is a schematic diagram of a capacitance detection principle.

FIG. 1 is a schematic diagram of a touch detection principle. FIG. 1 shows a horizontal and vertical two-layer channel in a touch control panel, and a capacitive touch control system using this pattern can usually adopt both self-capacitance and mutual-capacitance detection methods. When performing a self-capacitance detection, a touch control chip will scan the change of the self-capacitance of each horizontal channel and vertical channel to ground. When a finger approaches or touches, the self-capacitance of a channel near the finger can increase. When performing a mutual-capacitance detection, one of the channels is used as a driving channel (TX channel), and the other channel is used as a sensing channel (RX channel), and the touch control chip detects the change of the mutual-capacitance between the TX and RX. For example, as shown in FIG. 1, the finger and a horizontal channel $C_{RXN-1}$ near it can generate a capacitance Cs, and the finger and a vertical channel $C_{TX1}$ can generate a capacitance Cd. Since human body is a conductor and connected to the ground, both the self-capacitance and mutual capacitance of the channel touched or approached by the finger can change, and the touch control chip can calculate a touch position of the finger on the basis of the detected change the self-capacitance or mutual-capacitance.

Figure 2:
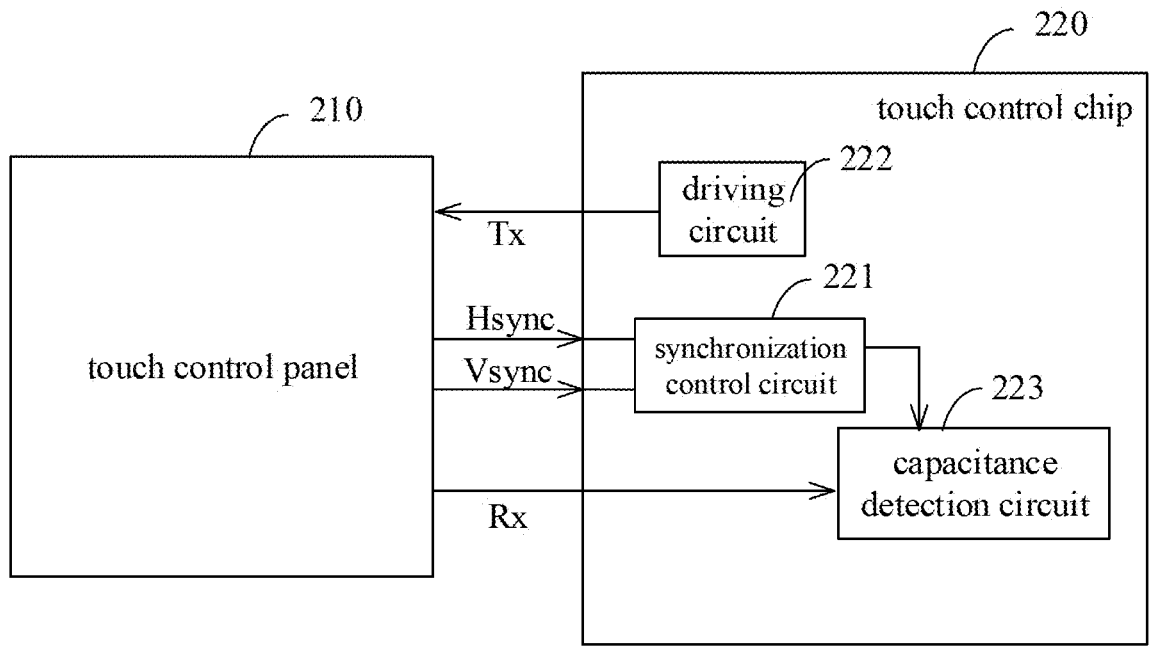
FIG. 2 is a schematic structural diagram of a possible capacitance detection system according to an embodiment of the present application.

FIG. 2 is a schematic structural diagram of a possible capacitance detection system involved in the present application. As shown in FIG. 2, a touch control panel 210 is connected to a touch control chip (touch control IC) 220, where the touch control IC 220 includes a synchronization control circuit 221, a driving circuit 222, and a capacitance detection circuit 223. The synchronization control circuit 221 is used to receive a horizontal synchronization signal (recorded as a Hsync signal) and a field synchronization signal (recorded as a Vsync signal) of a display, and generate a related trigger signal within the capacitance detection system. The driving circuit 222 is used to generate a driving signal, or called a coding signal, which can be input to the TX channel in the touch control panel. The capacitance detection circuit 223 can include, for example, programmable gain amplifier (PGA), analog antialiasing filter (AAF) with a low-pass characteristic, analog to digital conversion circuit (ADC) and so on. Specifically, PGA circuit can be used to receive a signal transmitted by the RX channel in the touch control panel and amplify it; the AAF circuit is connected to the PGA circuit to filter out an interference signal carried in the received electrical signal; and the ADC circuit is connected to the AAF circuit to convert an analog signal into a digital signal.

For a screen of an electronic device, especially a Y-OCTA screen, since this type of screen is different from a traditional LCD On-cell screen in terms of materials, laminates and manufacturing techniques, primary panel parameters have changed greatly, so that a display screen noise caused by a display driver integrated circuit (DDIC) in the screen is significantly increased. The display screen noise can affect the capacitance detection circuit in the touch screen, so that a detection sensitivity of the capacitance detection circuit to the self-capacitance and mutual-capacitance is significantly reduced.

To this end, the present application provides a capacitance detection circuit, which can reduce the influence of the display screen noise on the capacitance detection of the touch screen.

Figure 3:
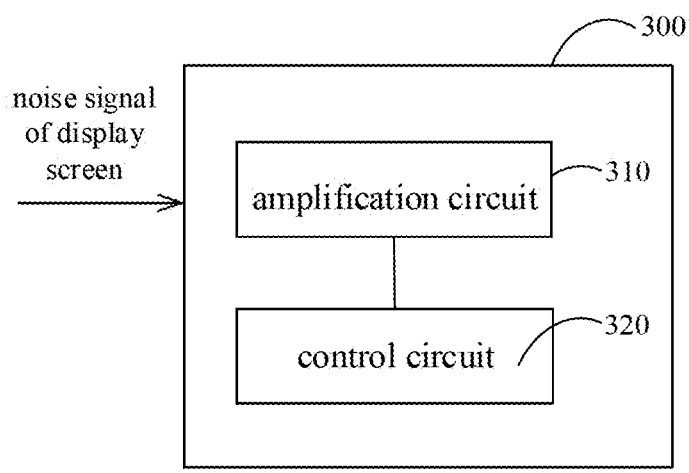
FIG. 3 is a schematic block diagram of a capacitance detection circuit according to an embodiment of the present application.

FIG. 3 is a schematic block diagram of a capacitance detection circuit according to an embodiment of the present application. As shown in FIG. 3, a capacitance detection circuit 300 includes an amplification circuit 310 and a control circuit 320.

The amplification circuit 310 is connected to a detection capacitance Cx in the touch screen (also called the touch control screen) to amplify a capacitance signal of the detection capacitance Cx and convert it into a voltage signal, where the voltage signal is used to determine the detection capacitance Cx.

The control circuit 320 is connected to the amplification circuit 310 to control a magnification of the amplification circuit 310. Specifically, a period in which a noise peak of a noise signal of a display screen is located includes consecutive N sub-periods, and a magnification of the amplification circuit 310 in the N sub-periods is inversely proportional to a magnitude of the noise signal in the N sub-periods, N>1.

It should be understood that the display screen and the touch control screen in the embodiments of the present application can be regarded as a display layer and a touch control layer in the screen of the electronic device. The screen of a circuit device generally includes the display layer and the touch control layer, which are used to implement a display function and a touch control function, respectively.

When the display screen is scanning, a scanning signal, such as the horizontal synchronization signal of the display screen, is correlated with the noise signal generated by the display screen. Specifically, the horizontal synchronization signal changes according to a certain rule, such as a periodic change, while phase difference between the noise signal of the display screen and the horizontal synchronization signal of the display screen is basically unchanged, so that the noise signal generated by the display screen can also change according to the certain rule.

In this embodiment, the noise signal generated by the display screen is divided in time, for example, the period in which the noise peak of the noise signal is located is divided into the N sub-periods, namely T1, T2, . . . , $T_i$, . . . . $T_N$. In the N sub-periods, the noise signal is variable. Therefore, the control circuit 320 can control the magnification of the amplification circuit 310 in the N sub-periods respectively according to the magnitude of the noise signal in the N sub-periods. Specifically, in the sub-periods where the noise signal is greater, the magnification of the amplification circuit 310 is smaller; and in the sub-periods where the noise signal is smaller, the magnification of the amplification circuit 310 is greater.

When performing the capacitance detection, based on, for example, transmission of the horizontal synchronization signal of the display screen, it can be determined in which periods the noise signal can be generated, so as to adjust the magnification of the amplification circuit 310 according to the corresponding magnification pre-set for different sub-periods.

It should be understood that the period in which the noise peak is located in the embodiments of the present application refers to a period between start time of display screen noise conversion from low magnitude to high magnitude and end time of display screen noise conversion from high magnitude to low level. For example, FIG. 4 shows three noise peaks, where each noise peak includes a period from T1 to T6; for another example, FIG. 5 shows three noise peaks, where both the first noise peak and the third noise include the period from T1 to T6, and the second noise peak includes a period from T8 to T12.

Figure 4:
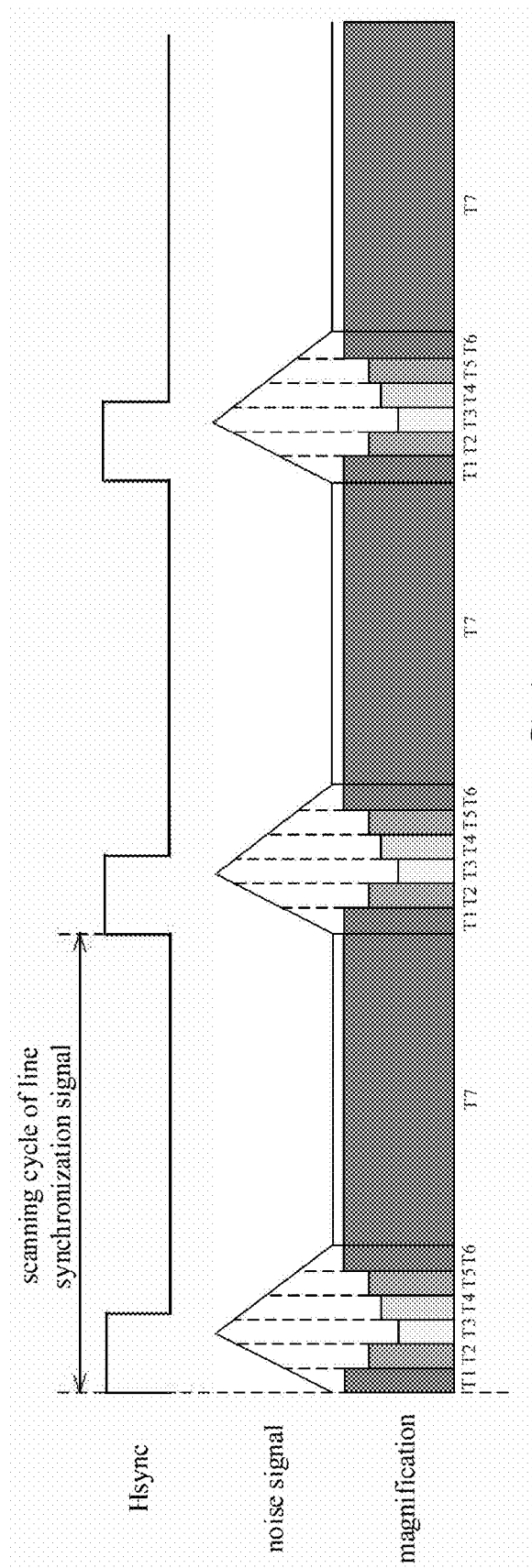
FIG. 4 is a schematic diagram of a relationship between noise magnitude and magnification.

For example, as shown in FIG. 4, assuming N=6, a period in which the noise peak of the noise signal generated by the display screen is located is divided into sub-periods T1, T2, T3, T4, T5, and T6. Specifically, in one noise peak, the display screen generates the greatest noise signal in the sub-period T3, and generate the smallest noise signal in the sub-periods T1 and T6. The control circuit 320 controls the magnification of the amplification circuit 310 in the sub-periods T1, T2, T3, T4, T5, and T6, which is inversely proportional to the magnitude of the noise signal, according to the magnitude of the noise signal generated by the display screen in the sub-periods T1, T2, T3, T4, T5, and T6, that is, a voltage amplitude of the noise signal. As shown in FIG. 4, as an example, when the magnification of the amplification circuit 310 in the sub-periods T1, T2, T3, T4, T5, and T6 is A1, A2, A3, A4, A5, and A6, respectively, A1=A6>A2=A5>A4>A3 can be controlled.

FIG. 4 shows a case where there is a noise peak in a horizontal synchronization scanning cycle, and in a practical application, there can be two or more noise peaks in the scanning cycle of a horizontal synchronization signal, and the change of the noise signal in the period in which each noise peak is located can be the same or different. Accordingly, the period in which each noise peak is located can be divided into the same or a different number of N sub-periods according to characteristics of each noise peak. For example, the period in which a first noise peak in the scanning cycle of the horizontal synchronization signal is located includes N1 sub-periods, the period in which a second noise peak is located includes N2 sub-periods.

Figure 5:
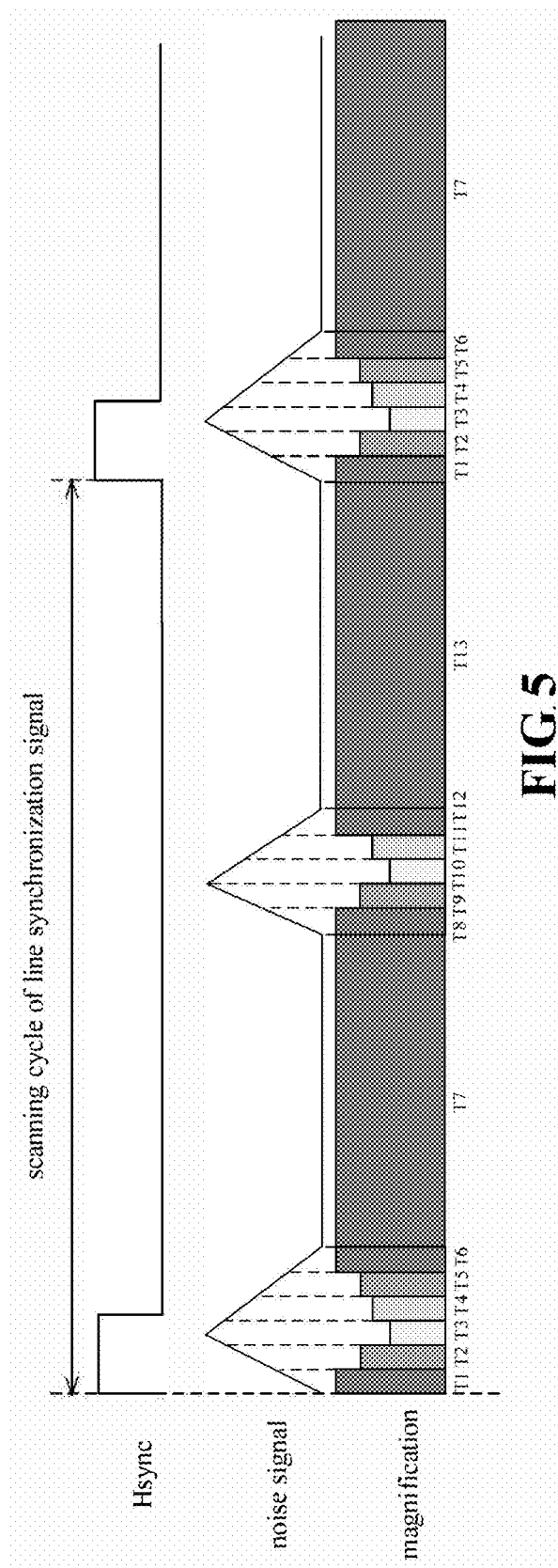
FIG. 5 is a schematic diagram of the relationship between the noise magnitude and magnification.

For example, as shown in FIG. 5, there are two noise peaks in a horizontal synchronization scanning cycle. The period in which a previous noise peak is located includes N1 sub-periods, N1=6, which are T1, T2, T3, T4, T5, and T6, respectively; and the period in which a latter noise peak is located includes N2 sub-periods, N2=5, which are T8, T9, T10, T11 and T12, respectively. Similarly, the control circuit 320 controls the magnification of the amplification circuit 310 in the sub-periods T1, T2, T3, T4, T5, and T6, which is inversely proportional to the magnitude of the noise signal; and the control circuit 320 controls the magnification of the amplification circuit 310 in the sub-periods T8, T9, T10, T11 and T12, which is inversely proportional to the magnitude of the noise signal. As shown in FIG. 5, as an example, when the magnification of the amplification circuit 310 in the sub-periods T1, T2, T3, T4, T5, and T6 is A1, A2, A3, A4, A5, and A6, respectively, A1=A6>A2=A5>A4>A3 can be controlled; and when the magnifications A8, A9, A10, A11 and A12 of the amplification circuit 310 in the sub-periods T8, T9, T10, T11 and T12 can be satisfied, A8=A12>A9>A11>A10 can be controlled.

It can be seen that, the period in which the noise peak of the noise signal of the display screen is located is divided into consecutive N sub-periods, and the magnification of the amplification circuit 310 in the N sub-periods is controlled by the control circuit 320, so that the magnification of the amplification circuit 310 in the N sub-periods is inversely proportional to the magnitude of the noise signal in the N sub-periods, in order to avoid saturation of the amplification circuit 310. In this way, the capacitance detection circuit 300 improves a signal-to-noise ratio of the capacitance detection while ensuring an effective operation of the amplification circuit 310, and has better detection performance.

In this embodiment, N>1, so that the capacitance detection circuit 300 has a stronger adaptability to noise changes, and can be applied to a case where there are a plurality of noise peaks in the scanning cycle of the horizontal synchronization signal.

Specifically, complexity of implementation will be greater when N is larger, while the noise changes cannot be better adapted when N is smaller. Therefore, preferably, N=3 or N=4.

The embodiments of the present application do not limit how to determine the magnitude of the noise signal in each sub-period of the N sub-periods. For example, it can be determined according to the magnitude of the noise signal at a certain time in the sub-period; for another example, it can be determined according to an average value of the noise signal at a plurality of times in the sub-period. This is not limited in the present application.

There can be an idea reciprocal relationship between the magnitude of the noise signal in the N sub-periods and the magnification of the amplification circuit 310 in the N sub-periods. For example, in FIG. 4, a ratio between the magnitude of the noise signal in the sub-period T1 and the magnitude of the noise signal in the sub-period T2 can be equal to a ratio between a magnification A2 of the amplification circuit 310 in the sub-period T2 and a magnification A1 of the amplification circuit 310 in the sub-period T1. But the present application is not limited thereto. In a case where the magnitude of the noise signal in the sub-period T1 is smaller than the magnitude of the noise signal in the sub-period T2, it is only necessary to make A1>A2.

The magnification of the amplification circuit 310 in the period in which a non-noise peak of the noise signal of the display screen is located can be a constant value. For example, the constant value can be greater than or equal to a maximum magnification of the amplification circuit 310 in the N sub-periods. For example, in the period T7 in which the non-noise peak in FIG. 4 or FIG. 5 is located, the magnification of the amplification circuit 310 can be equal to a maximum magnification of the amplification circuit 310 in the N sub-periods, that is, be equal to the magnification corresponding to the sub-periods T1 and T6; and can be greater than the magnification of the amplification circuit 310 in the N sub-periods, that is, be greater than the magnification corresponding to the sub-periods T1 and T6. For another example, in the period T13 in which the non-noise peak in FIG. 5 is located, the magnification of the amplification circuit 310 can be equal to a maximum magnification of the amplification circuit 310 in the N2 sub-periods, that is, be equal to the magnification corresponding to the sub-periods 18 and T12; and can be greater than the magnification of the amplification circuit 310 in the N2 sub-periods, that is, the magnification corresponding to the sub-periods T8 and T12.

The embodiments of the present application do not limit how to determine the noise peak. The period in which the noise peak of the noise signal is located is determined according to a scanning frequency of the horizontal synchronization signal of the display screen. For example, by detecting an output signal of the capacitance detection circuit 300, a phase relationship between the noise peak of the noise signal and the horizontal synchronization signal of the display screen can be acquired, and furthermore, the magnitude of the noise peak can be acquired. Accordingly, it can be determined the magnification of the amplification circuit 310 corresponding to the N sub-periods within the period in which the noise peak is located.

An input end of the amplification circuit 310 is connected to the detection capacitance Cx, and outputs a voltage signal associated with the detection capacitance Cx. After the magnification of the amplification circuit 310 is adjusted, the amplified voltage signal can be output based on the magnification. When the capacitance of the detection capacitance Cx changes, the voltage signal output by the amplification circuit 310 also changes. Therefore, the size or the change of the detection capacitance Cx can be determined according to the size of the voltage signal output by the amplification circuit 310. That is, the amplification circuit 310 can convert the capacitance signal of the detection capacitance Cx into the voltage signal and amplify it, so as to implement a detection of the detection capacitance Cx.

The control circuit 310 is connected to the amplification circuit 310 to control the magnification of the amplification circuit 310. Specifically, the amplification circuit 310 has the greater magnification in a sub-period with the lower display screen noise to improve the SNR of the capacitance detection; while the amplification circuit 310 has the smaller magnification in a sub-period with the higher display screen noise, so as to avoid the saturation of the amplification circuit 310 and ensure the effective operation of the amplification circuit 310. Therefore, the capacitance detection circuit 300 improves the signal-to-noise ratio of the capacitance detection while ensuring the effective operation of the amplification circuit 310, and has the better detection performance.

The capacitance detection circuit in the embodiments of the present application can be used for the mutual-capacitance detection or the self-capacitance detection, and the detection capacitance Cx can be the self-capacitance of the TX channel or the RX channel to the ground, or the detection capacitance Cx can be the mutual-capacitance between the TX channel and the RX channel. The TX channel is used to input the driving signal. The RX channel is used to sense the driving signal and generate a detection signal. The following is described merely by an example of the mutual-capacitance detection.

Optionally, in an implementation manner, the amplification circuit 310 includes an operational amplifier, for example, the amplification circuit 310 can be the programmable gain amplifier (PGA). Specifically, an adjustable resistance is connected between an input end and an output end of the operational amplifier, which is also known as a variable resistance, and the control circuit 320 is specifically used to: control a resistance value of the adjustable resistance, so that the magnification of the amplification circuit 310 in the above N sub-periods is inversely proportional to the magnitude of the noise signal in the N sub-periods.

Figure 6:
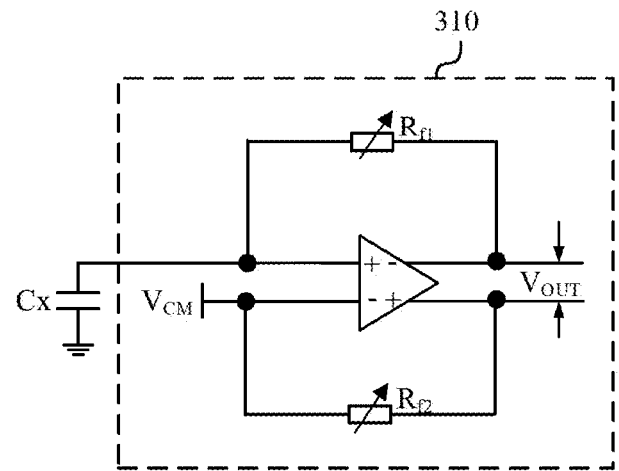
FIG. 6 is a schematic diagram of an amplification circuit according to an embodiment of the present applicant.

For example, as shown in FIG. 6, the operational amplifier can be a differential operational amplifier, which can convert the capacitance signal of the detection capacitance Cx into a voltage signal $V_{OUT}$, and the voltage signal $V_{OUT}$ is a differential signal with the better signal-to-noise ratio. An adjustable resistance $R_{f1}$ is connected between a first input end and a first output end of the differential operational amplifier, and an adjustable resistance $R_{f2}$ is connected between a second input end and a second output end of the differential operational amplifier. Specifically, $R_{f1}$ is equal to $R_{f2}$, preferably.

$R_{f1}$ and $R_{f2}$ can have a plurality of gear positions, the plurality of gear positions correspond to a plurality of resistance values, and the plurality of resistance values are respectively used to match the noise signal in the N sub-periods. Specifically, in the sub-periods where the noise signal is greater, $R_{f1}$ and $R_{f2}$ can be adjusted to smaller resistance values, so that the amplification circuit 310 has the smaller magnification; while in the sub-periods where the noise signal is smaller, $R_{f1}$ and $R_{f2}$ can be adjusted to greater resistance values, so that the amplification circuit 310 has the greater magnification.

In this embodiment, a feedback capacitance $C_{f1}$ and a feedback capacitance $C_{f2}$ respectively connected in parallel with a feedback resistance $R_{f1}$ and a feedback resistance $R_{f2}$ can be provided between the input end and the output end of the operational amplifier.

Optionally, the capacitance detection circuit 300 further includes: a filter circuit 340, connected to the amplification circuit 310, and used to perform filtering processing on the voltage signal output by the amplification circuit 310.

Optionally, the capacitance detection circuit 300 further includes: an ADC circuit 350, connected to the filter circuit 340, and used to convert the filtered voltage signal into a digital signal.

Figure 7:
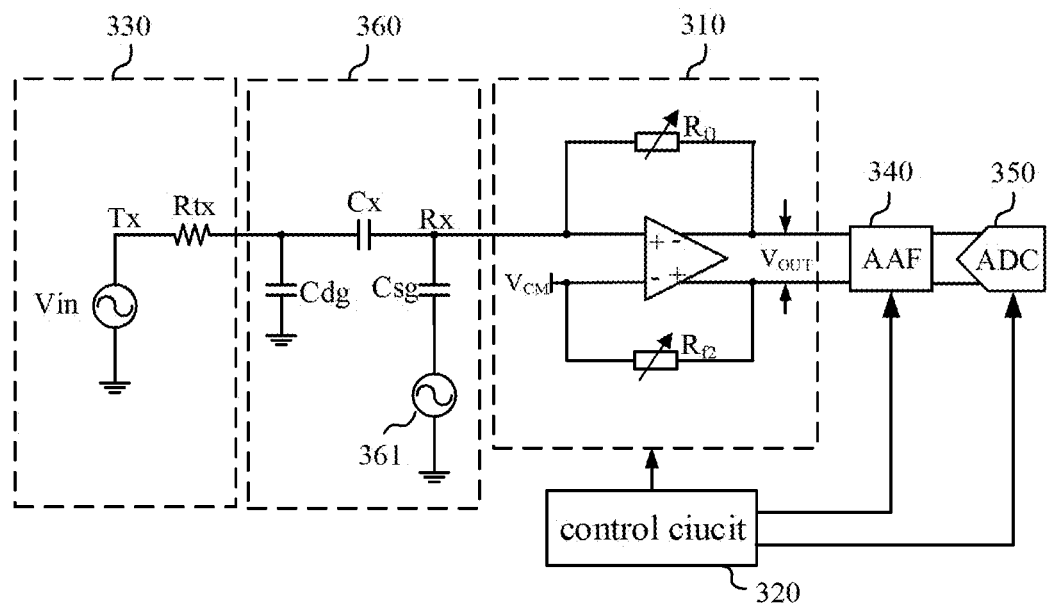
FIG. 7 is a possible specific implementation manner based on the capacitance detection circuit shown in FIG. 3.

FIG. 7 shows a possible implementation manner based on the circuit shown in FIG. 3. FIG. 7 shows a driving circuit 330, a mutual-capacitance model 360 of the touch screen, and the amplification circuit 310, the control circuit 320, the filter circuit 340 and a sampling circuit 350 in the capacitance detection circuit 300. The mutual-capacitance model 360 of the touch screen is an equivalent diagram of a touch control module in the screen, where Csg is an equivalent capacitance of the RX channel, Cdg is an equivalent capacitance of the drive channel TX, and the detection capacitance Cx is an equivalent capacitance between the RX channel and the TX channel Rtx is a driving impedance of the driving circuit 330, and 361 is a noise signal source in the display screen. One end of the detection capacitance Cx is connected to system ground, and the other end is connected to the amplification circuit 310. When the finger touches, the mutual-capacitance between the RX channel and the TX channel of touch position can be increased. The capacitance detection circuit 300 can obtain a user's touch information by detecting the mutual-capacitance, that is, capacitance change of Cx.

The driving circuit 330 is used to generate the driving signal, which is input to the TX channel, and generate a sensing signal on the RX channel, and the sensing signal is input to the amplification circuit 310. The voltage signal $V_{OUT}$ output by the amplification circuit 310 can be used to determine the mutual-capacitance, that is, the size of Cx, between the TX channel and the RX channel. The filter circuit 340 can be, for example, an analog antialiasing filter (AAF) with the low-pass characteristic to avoid aliasing of a high frequency signal or noise into the sample circuit 150. The sample circuit 350 is, for example, an analog-to-digital converter (ADC) circuit, and used to convert the voltage signal into the digital signal, so that a digital system can process it. The control circuit 320 can control the gear position of the adjustable resistance in the amplification circuit 310, so that the magnification of the amplification circuit 310 has the greater magnification in the sub-periods with the lower noise, and has the smaller magnification in the sub-periods with the greater noise. In addition, the control circuit 320 can further control other parts of the capacitance detection circuit 300, such as a cut-off frequency of the filter circuit 340.

It can be seen that, the period in which the noise peak of the noise signal of the display screen is located is divided into consecutive N sub-periods, and the magnification of the amplification circuit 310 in the N sub-periods is controlled by the control circuit 320, so that the magnification of the amplification circuit 310 in the N sub-periods is inversely proportional to the magnitude of the noise signal in the N sub-periods, in order to avoid the saturation of the amplification circuit 310. In this way, the capacitance detection circuit 300 improves the signal-to-noise ratio of the capacitance detection while ensuring the effective operation of the amplification circuit 310, and has the better detection performance.

Figure 8:
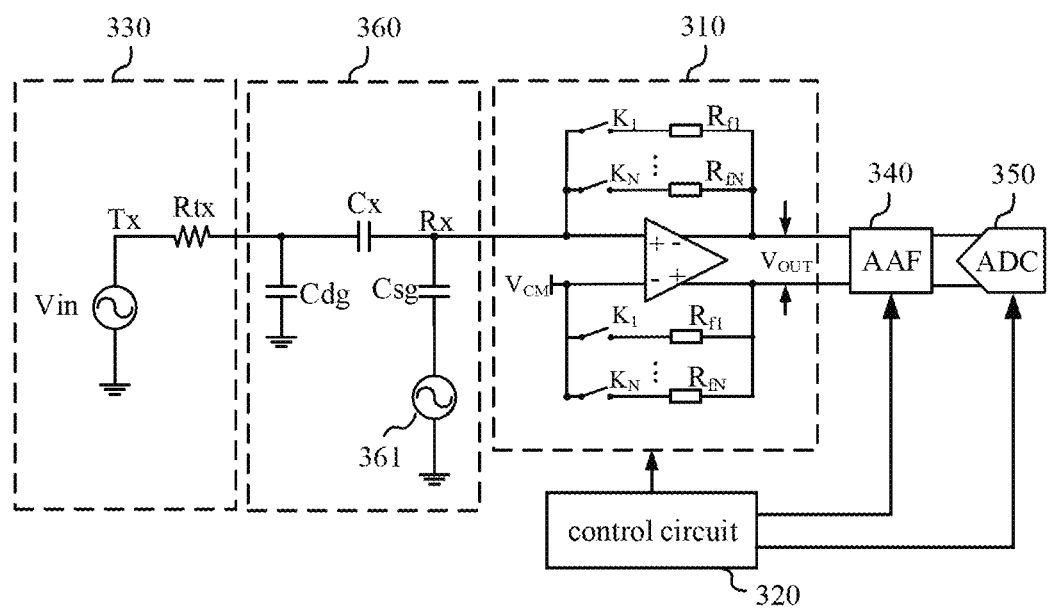
FIG. 8 is a possible specific implementation manner based on the capacitance detection circuit shown in FIG. 3.

It should be appreciated that the adjustable resistance can be regarded as a resistance network, the resistance network includes a plurality of resistances with different resistance values. The control circuit 320 controls a switch connected in series with each resistance to gate the resistance. For example, in the amplification circuit 310 shown in FIG. 8, the feedback resistances $R_{f1}$ to $R_{fN}$ have different resistance values. It should be understood that the control circuit 320 can control closing and opening of switches K1 to $K_N$ by a control signal, so as to choose appropriate feedback resistances in different sub-periods, so that the amplification 320 has the magnification matching the noise in the sub-period.

The embodiments of the present application further provide a touch control chip, including the capacitance detection circuit in the foregoing various embodiments of the present application.

The embodiments of the present application further provides an electronic device, and the electronic device includes: a touch screen: a display screen; and the touch control chip in the foregoing various embodiments of the present application.

By way of example and not limitation, the electronic device in the embodiments of the present application can be portable or mobile computing devices such as a terminal device, a mobile phone, a tablet computer, a notebook computer, a desktop computer, a gaming device, an in-vehicle electronic device or a wearable smart device, and other electronic devices such as an electronic database, an automobile and an automated teller machine (ATM). The wearable smart device includes a device such as a smart watch or smart glasses, that is of a full-featured and a large-sized and that can implement all or some functions without relying on a smart phone, and a device such as a smart bracelet or a smart jewelry for physical sign monitoring, that only focuses on a certain type of application function and shall be used in cooperation with other device such as a smart phone.

It should be appreciated that, in a case of no conflict, the various embodiments and/or the technical features in the various embodiments described in the present application can be combined with each other arbitrarily, and the technical solutions obtained after the combination should also fall within the protection scope of the present application.

It should be appreciated that specific examples in embodiments of the present application are just for helping those skilled in the art better understand the embodiments of the present application, rather than for limiting the scope of the embodiments of the present application. Those skilled in the art can make various improvements and variations on the basis of the above embodiments, and such improvements or variations are all within the protection scope of the present application.

The foregoing descriptions are merely specific implementation manners of the present application. However, the protection scope of the present application is not limited thereto, and those skilled in the art who are familiar with the art could readily think of variations or substitutions within the technical scope disclosed by the present application, and these variations or substitutions shall fall within the protection scope of the present application. Therefore, the protection scope of the present disclosure shall be subject to the protection scope of the claims.

What is claimed is:

1. A capacitance detection circuit, comprising:
   an amplification circuit, connected to a detection capacitance in a touch screen, and configured to amplify a capacitance signal of the detection capacitance and convert the capacitance signal into a voltage signal, the voltage signal configured to determine the detection capacitance; and
   a control circuit, connected to the amplification circuit, and configured to control a magnification of the amplification circuit, wherein a period in which a noise peak of a noise signal of a display screen is located comprises consecutive N sub-periods, and a magnification of the amplification circuit in the N sub-periods is inversely proportional to a magnitude of the noise signal in the N sub-periods, N>1.

2. The capacitance detection circuit according to claim 1, wherein the amplification circuit comprises an operational amplifier, an adjustable resistance is connected between an input end and an output end of the operational amplifier, and the control circuit is specifically configured to:
   control a resistance value of the adjustable resistance, so that the magnification of the amplification circuit in the N sub-periods is inversely proportional to the magnitude of the noise signal in the N sub-periods.

3. The capacitance detection circuit according to claim 2, wherein the operational amplifier is a differential operational amplifier,
   one adjustable resistance is connected between a first input end and a first output end of the differential operational amplifier, and one adjustable resistance is connected between a second input end and a second output end of the differential operational amplifier.

4. The capacitance detection circuit according to claim 1, wherein a magnification of the amplification circuit is a constant value in a period in which a non-noise peak of the noise signal is located.

5. The capacitance detection circuit according to claim 4, wherein the constant value is greater than or equal to a maximum magnification of the amplification circuit in the N sub-periods.

6. The capacitance detection circuit according to claim 1, wherein N=3 or N=4.

7. The capacitance detection circuit according to claim 1, wherein a period in which the noise peak of the noise signal is located is determined according to a scanning frequency of a horizontal synchronization signal of the display screen.

8. The capacitance detection circuit according to claim 1, wherein a scanning cycle of the horizontal synchronization signal of the display screen comprises one or two of the noise peaks.

9. The capacitance detection circuit according to claim 1, wherein the capacitance detection circuit further comprises:
   a filter circuit, connected to the amplification circuit, and configured to perform filtering processing on the voltage signal output by the amplification circuit.

10. The capacitance detection circuit according to claim 9, wherein the capacitance detection circuit further comprises:
    an analog to digital conversion, ADC, circuit, connected to the filter circuit, and configured to convert the filtered voltage signal into a digital signal.

11. A touch control chip, comprising a capacitance detection circuit, wherein the capacitance detection circuit comprises:

an amplification circuit, connected to a detection capacitance in a touch screen, and configured to amplify a capacitance signal of the detection capacitance and convert the capacitance signal into a voltage signal, the voltage signal configured to determine the detection capacitance; and a control circuit, connected to the amplification circuit, and configured to control a magnification of the amplification circuit, wherein a period in which a noise peak of a noise signal of a display screen is located comprises consecutive N sub-periods, and a magnification of the amplification circuit in the N sub-periods is inversely proportional to a magnitude of the noise signal in the N sub-periods, N>1.

12. The touch control chip according to claim 11, wherein the amplification circuit comprises an operational amplifier, an adjustable resistance is connected between an input end and an output end of the operational amplifier, and the control circuit is specifically configured to:

control a resistance value of the adjustable resistance, so that the magnification of the amplification circuit in the N sub-periods is inversely proportional to the magnitude of the noise signal in the N sub-periods.

13. The touch control chip according to claim 12, wherein the operational amplifier is a differential operational amplifier, one adjustable resistance is connected between a first input end and a first output end of the differential operational amplifier, and one adjustable resistance is connected between a second input end and a second output end of the differential operational amplifier.

14. The touch control chip according to claim 11, wherein a magnification of the amplification circuit is a constant value in a period in which a non-noise peak of the noise signal is located.

15. The touch control chip according to claim 14, wherein the constant value is greater than or equal to a maximum magnification of the amplification circuit in the N sub-periods.

16. The touch control chip according to claim 11, wherein N=3 or N=4.

17. The touch control chip according to claim 11, wherein a period in which the noise peak of the noise signal is located is determined according to a scanning frequency of a horizontal synchronization signal of the display screen.

18. The touch control chip according to claim 11, wherein a scanning cycle of the horizontal synchronization signal of the display screen comprises one or two of the noise peaks.

19. The touch control chip according to claim 11, wherein the capacitance detection circuit further comprises:

a filter circuit, connected to the amplification circuit, and configured to perform filtering processing on the voltage signal output by the amplification circuit.

20. An electronic device, comprising:

a touch screen;

a display screen; and the touch control chip according to claim 11.

* * * * *